(12) United States Patent
Asai et al.

(10) Patent No.: US 6,554,896 B1
(45) Date of Patent: Apr. 29, 2003

(54) EPITAXIAL GROWTH SUBSTRATE AND A METHOD FOR PRODUCING THE SAME

(75) Inventors: Keiichiro Asai, Nagoya (JP); Tomohiko Shibata, Kasugai (JP); Yukinori Nakamura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/713,636

(22) Filed: Nov. 15, 2000

(30) Foreign Application Priority Data

Nov. 17, 1999 (JP) ............................................. 11-326561

(51) Int. Cl.$^7$ ................................................. C30B 29/40
(52) U.S. Cl. ............................ 117/89; 117/84; 117/952; 438/692
(58) Field of Search .................. 117/932, 843, 117/89; 438/692

(56) References Cited

U.S. PATENT DOCUMENTS 6,020,602 A * 2/2000 Sugawara et al. .......... 257/103

FOREIGN PATENT DOCUMENTS

WO     WO 98/45511     * 10/1998

OTHER PUBLICATIONS

Weyher et al, Chemical Polishing of Bulk and Epitaxial GaN Journal of Crystal Growth, vol. 182 p. 17–22, 1997.*

* cited by examiner

Primary Examiner—Robert Kunemund
(74) Attorney, Agent, or Firm—Burr & Brown

(57) ABSTRACT

An $Al_xGa_yIn_zN(x+y+z=1, x,y,z \geq 0)$ film is epitaxially grown, for example to a thickness of about 1.0 μm, on a surface of a base material. A surface of the $Al_xGa_yIn_zN$ film opposing the base material is polished and thus, flattened to have a surface roughness Ra of less than 10 Å and a thickness of about 1.0 μm. A high crystallinity nitride film is interposed between the base material and the $Al_xGa_yIn_zN$ film.

10 Claims, 5 Drawing Sheets

EPITAXIAL GROWTH SUBSTRATE AND A METHOD FOR PRODUCING THE SAME

FIELD OF THE INVENTION

This invention relates to an epitaxial growth substrate comprising a base material composed of a sapphire substrate, a SiC substrate, a GaN substrate or the like and an $Al_xGa_yIn_zN$ film ($x+y+z=1, x>0, y, z \geq 0$) on the base material, and a method for producing the same.

BACKGROUND OF THE INVENTION

An epitaxial growth substrate is employed for an electronic device such as a light emitting diode (LED), a laser diode (LD) or a field effect transistor (FET). In producing such an electronic device, semiconductor films such as $Al_xGa_yIn_zN$ film ($x+y+z=1, x, y, z \geq 0$) are formed on the epitaxial growth substrate by epitaxial growth. Attention is paid to an $Al_xGa_yIn_zN$ film ($x+y+z=1, x, y, z \geq 0$) because it has a large bandgap to generate and emit a short wavelength light in a light emitting element.

FIG. 1 is a cross sectional view showing a conventional light emitting diode to generate a blue light, which is composed of the above $Al_xGa_yIn_zN$ films.

For example, a GaN film 2 as a buffer layer is formed on a C-face sapphire ($Al_2O_3$) substrate 1 at a low temperature by CVD, and an n-type $Al_xGa_yIn_zN$ film 3 is formed on the GaN film 2 by epitaxial growth through CVD. Then, a p-type $Al_xGa_yIn_zN$ film 4 is epitaxially grown on the n-type $Al_xGa_yIn_zN$ film 3 by epitaxial growth through CVD, and a low resistive p-type $Al_xGa_yIn_zN$ film 5 is epitaxially grown on the p-type $Al_xGa_yIn_zN$ film 4.

Electrodes 6 and 7 are formed on the n-type $Al_xGa_yIn_zN$ film 3 and the p-type $Al_xGa_yIn_zN$ film 5, respectively.

If the n-type $Al_xGa_yIn_zN$ film 3 is directly formed on the sapphire substrate 1 by CVD, it has a large amount of defects, degraded crystallinity and a relatively rough surface. Therefore, in this case, the light emitting diode having the directly formed n-type $Al_xGa_yIn_zN$ film can have a relatively small light emission efficiency.

Therefore, as shown in FIG. 1, the GaN film 2, which is formed at a low temperature by CVD, intervenes as th e buffer layer between the sapphire substrate 1 and the n-type $Al_xGa_yIn_zN$ film 3. Since the GaN film 2 is grown at a low temperature by CVD, the lattice constant difference of approximately 10% between the sapphire substrate 1 and the n-type GaN film 3 is compensated. Moreover, it is proposed that an AlN film is employed as the buffer layer instead of the GaN film 2.

Moreover, instead of forming the GaN film or the AlN film by epitaxial growth at a low temperature by CVD, the sapphire substrate 1 is exposed to an ammonia atmosphere under a high temperature of 1000° C. to nitride its surface and form an AlN film with a thickness of 100 Å or below thereon. The AlN film serves as the above buffer layer, so that the lattice constant difference between the sapphire substrate 1 and the GaN film 3 is compensated.

The present invention is directed at providing an epitaxial growth substrate comprising a base material composed of a sapphire substrate, a SiC substrate, a GaN substrate or the like and a $Al_xGa_yIn_zN$ film ($x+y+z=1, x, y, z \geq 0$) formed on one main surface of the base material. However, as mentioned above, if the $Al_xGa_yIn_zN$ film is directly formed on such a sapphire substrate by CVD, it can have only a degraded crystallinity and a relatively rough surface.

Then, using the above epitaxial growth technique for the above GaN film, a GaN film or an AlN film is formed, as a buffer layer, in a thickness of 1001–300 Å on the sapphire substrate by epitaxial growth at a low temperature by CVD. As a result, the $Al_xGa_yIn_zN$ film, formed on the buffer layer, can have a relatively good crystallinity and a flat surface. However, the crystallinity of the $Al_xGa_yIn_zN$ film is sensitive to the buffer layer configuration such as thickness and the buffer layer-forming conditions, and the buffer layer itself is formed at a low temperature, so that the crystallinity of the $Al_xGa_yIn_zN$ film can not be sufficiently improved because of its low crystallization.

Moreover, when an n-type $Al_xGa_yIn_zN$ ($x+y+z=1, x, y, z \geq 0$) film is formed, by epitaxial growth at a high temperature by CVD, on an AlN film having a thickness of 100 Å or below formed by the exposure of the sapphire substrate to a high temperature ammonia atmosphere, it can have excellent crystallinity, but usually does not have a flat surface. The rough surface flatness may result from the thermal treatment at a high temperature in forming the AlN film. On the other hand, the high crystallinity may result from the crystallinity of the sapphire substrate because the AlN film is obtained by improving the surface layer of the substrate.

The above rough surface flatness and high crystallinity is observed for an $Al_xGa_yIn_zN$ ($x+y+z=1, x, y, z \geq 0$) film formed on a SiC substrate and a GaN substrate instead of the sapphire substrate. In this way, the above-mentioned conventional technique can provide only the $Al_xGa_yIn_zN$ film having excellent surface flatness but degraded crystallinity, or the $Al_xGa_yIn_zN$ film having excellent crystallinity through a small amount of defects but degraded surface flatness. Up to now, the $Al_xGa_yIn_zN$ film having both excellent crystallinity and surface flatness could not be provided.

SUMMARY OF THE INVENTION

It is an object of the present invention to provide an epitaxial growth substrate on which the $Al_xGa_yIn_zN$ ($x+y+z=1, x, y, z \geq 0$) film having both excellent crystallinity through a small amount of defects and surface flatness formed by epitaxial growth.

It is another object of the present invention to provide a method for producing the above epitaxial growth substrate.

This invention relates to an epitaxial growth substrate comprising a base material and an $Al_xGa_yIn_zN$ ($x+y+z=1, x, y, z \geq 0$) film, on one surface of the base material, of which the opposite surface to the base material is polished and thus, flattened.

Since the $Al_xGa_yIn_zN$ film constituting the epitaxial growth substrate of the present invention is epitaxially grown and flattened by polishing, it can have its excellent crystallinity and surface flatness. Accordingly, when an additional $Al_xGa_yIn_zN$ ($x+y+z=1, x, y, z \geq 0$) film is formed on the epitaxial growth substrate by epitaxially growth, it can have excellent crystallinity and surface flatness.

For enhancing the crystallinity and surface flatness of the additional $Al_xGa_yIn_zN$ film, it is preferable that the epitaxial growth substrate has a high crystallinity nitride film between the base material and the $Al_xGa_yIn_zN$ film.

This invention also relates to a method for producing an epitaxial growth substrate comprising the steps of:

preparing a base material, epitaxially growing an $Al_xGa_yIn_zN$ ($x+y+z=1, x, y, z \geq 0$) film on one surface of the base material, and polishing and thus, flattening the opposite surface of the $Al_xGa_yIn_zN$ film on the base material.

According to the producing method of the present invention, the above epitaxial growth substrate can be easily and precisely formed. Therefore, in this case, it is preferable to form a high crystallinity nitride film between the base material and the $Al_xGa_yIn_zN$ film, in view of the above enhancement for the crystallinity and surface flatness of the additional $Al_xGa_yIn_zN$ film.

BRIEF DESCRIPTION OF THE DRAWINGS

For better understanding of the present invention, reference is made to the attached drawings, wherein.

DETAILED DESCRIPTION OF THE INVENTION

Figure 1:
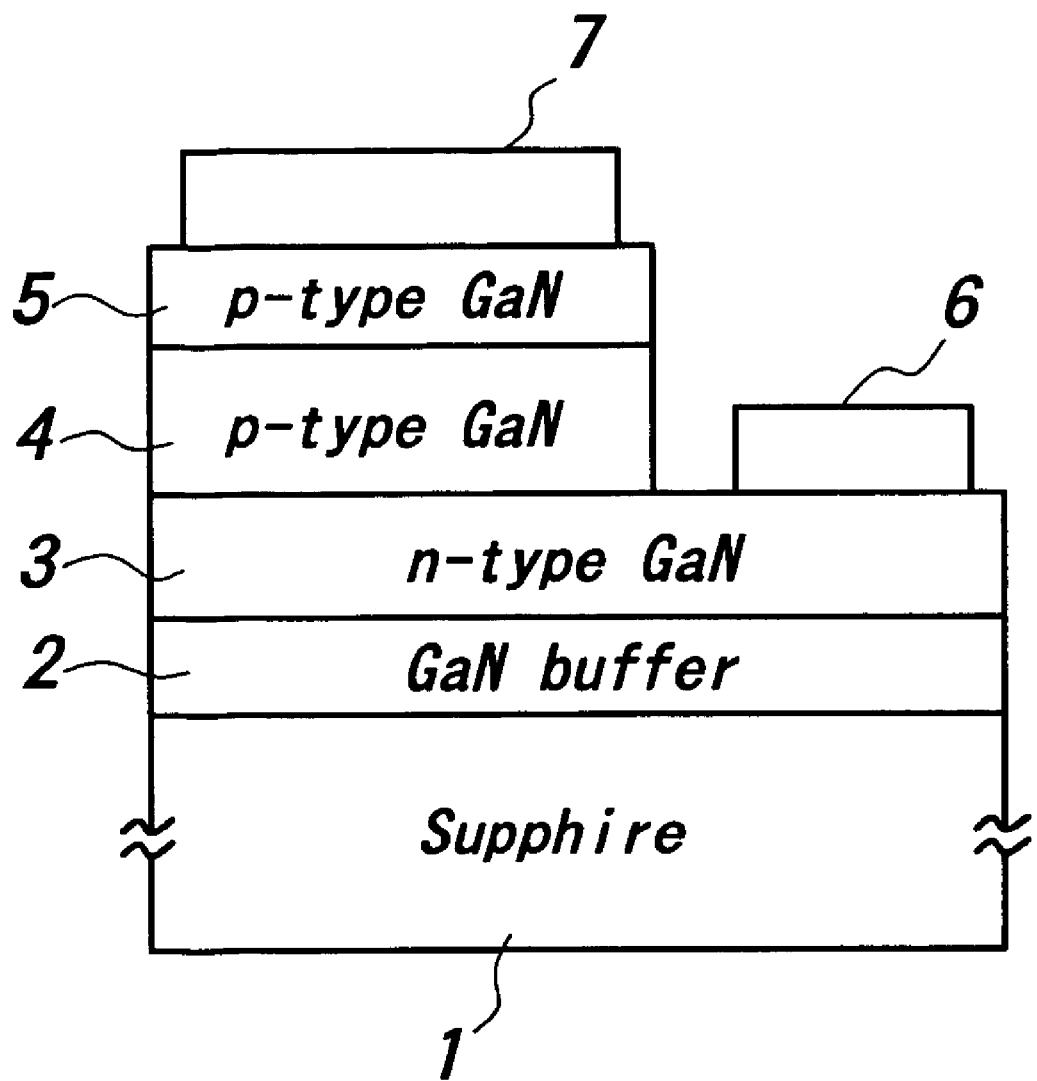
FIG. 1 is a cross sectional view showing the construction of a conventional light emitting diode.
Figure 2A:
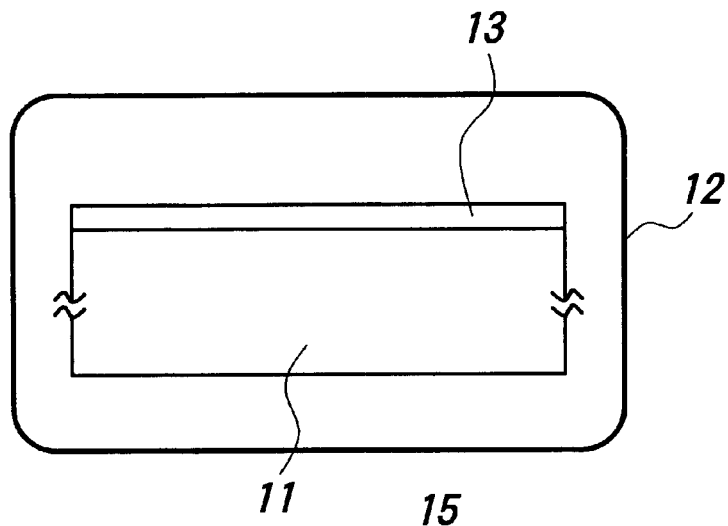
FIGS. 2a–2c are cross sectional views showing successive steps in producing an epitaxial growth substrate according to the present invention.
Figure 2B:
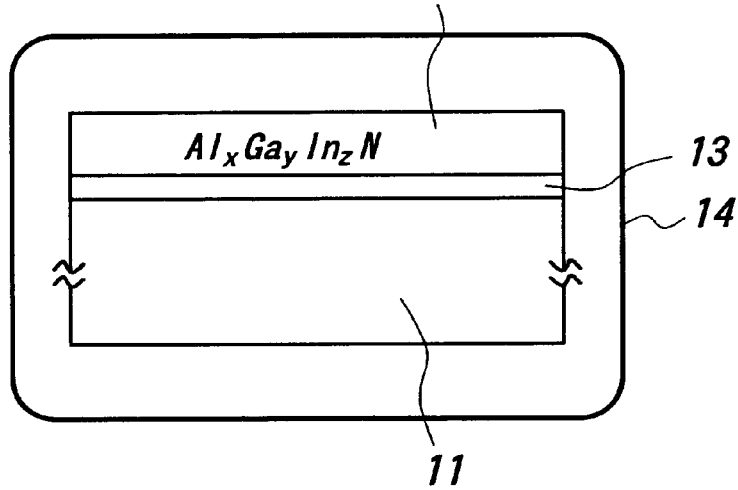
Figure 2C:
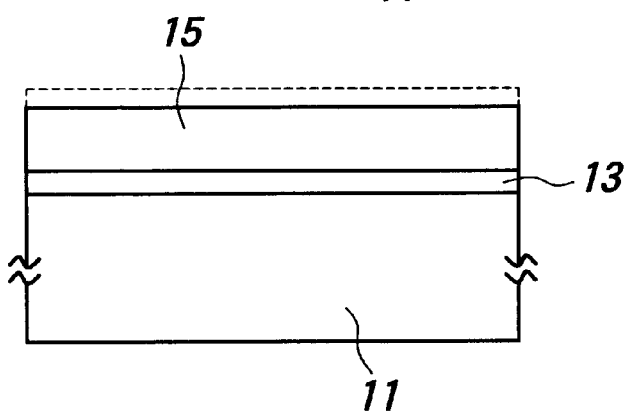

FIGS. 2a–2c are cross sectional views showing successive steps in producing an epitaxial growth substrate according to the present invention. First of all, as shown in FIG. 2a, a sapphire substrate 11 as a base material is set into a nitriding vessel 12 having an high temperature ammonia atmosphere of 1000° C. therein, and is exposed to the high temperature ammonia atmosphere to form an aluminum nitride film 13 on the C-face of the sapphire substrate. The aluminum nitride film has a small thickness of 100 Å, for example.

Next, as shown in FIG. 2b, the sapphire substrate 11 having the aluminum nitride film 13 on the C-face thereof is set into a CVD chamber 14, and an $Al_xGa_yIn_zN$ (x+y+z=1, x,y,z≧0) film 15 is epitaxially grown in a thickness of 1.1 μm on the aluminum nitride film 13. The nitriding vessel 12 can be common to the CVD chamber 14. In this case, since the $Al_xGa_yIn_zN$ film 15 is formed, by epitaxial growth, on the aluminum nitride film 13 which is formed by nitriding the C-face of the sapphire substrate 11, it can have excellent crystallinity through a small amount of defects, but can not have excellent surface flatness. Therefore, if an additional $Al_xGa_yIn_zN$ film is epitaxially grown on the $Al_xGa_yIn_zN$ film 15, it can not have excellent characteristics due to the relatively rough surface of the aluminum nitride film 13. As a result, the epitaxial growth substrate composed of the sapphire substrate 11 and the $Al_xGa_yIn_zN$ film 15 can not be practically used.

In this invention, as shown in FIG. 2c, the surface part of the $Al_xGa_yIn_zN$ film 15 is polished by chemical mechanical polishing, so that the $Al_xGa_yIn_zN$ film 15 is flattened. The polishing can be carried out up to a surface roughness Ra=10 Å, and thus, the polished $Al_xGa_yIn_zN$ film 15 has a thickness of about 1.0 μm.

Figure 3A:
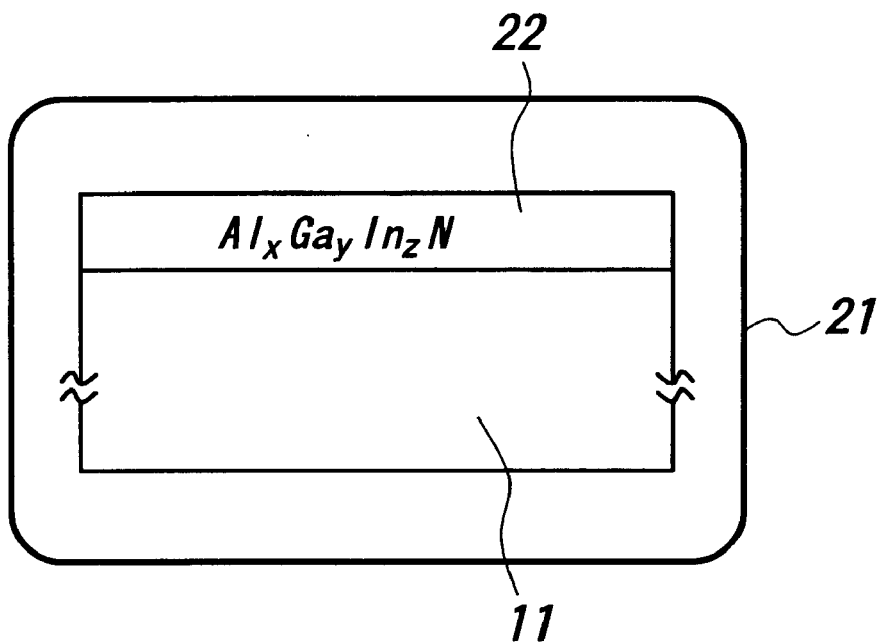
FIGS. 3a and 3b are cross sectional views showing successive steps in producing another epitaxial growth substrate according to the present invention.
Figure 3B:
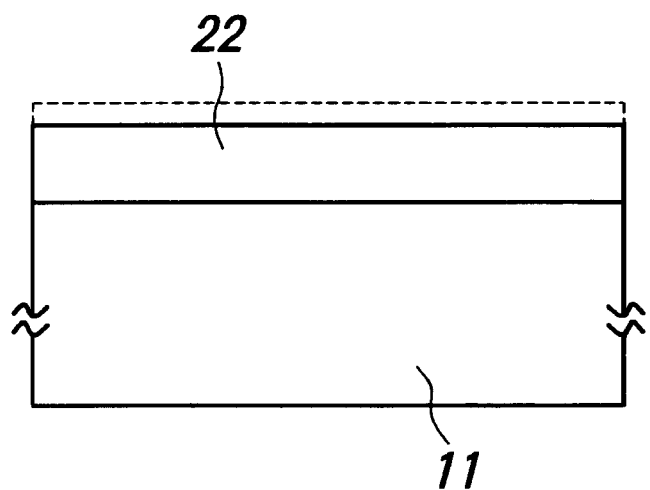

FIGS. 3a and 3b are cross sectional views showing successive steps in producing another epitaxial growth substrate according to the present invention. In this example, as shown in FIG. 3a, the sapphire substrate 11 as a base material is set into a CVD chamber 21, and an $Al_xGa_yIn_zN$ film 22 is epitaxially grown in a thickness of 1.1 μm on the C-face of the substrate by high temperature CVD under a temperature of 1000° C. or over. In this case, the $Al_xGa_yIn_zN$ film 22 can have excellent crystallinity through a small amount of defects by the epitaxial growth at the high temperature. Then, the sapphire substrate 11 having the $Al_xGa_yIn_zN$ film 22 thereon is taken out of the CVD chamber 21, and as shown in FIG. 3b, the surface part of the $Al_xGa_yIn_zN$ film 22 is polished to a thickness of about 1.0 μm by chemical mechanical polishing. If an additional $Al_xGa_yIn_zN$ film is formed on the $Al_xGa_yIn_zN$ film 22 by epitaxial growth, it can have excellent crystallinity and surface flatness.

Figure 4A:
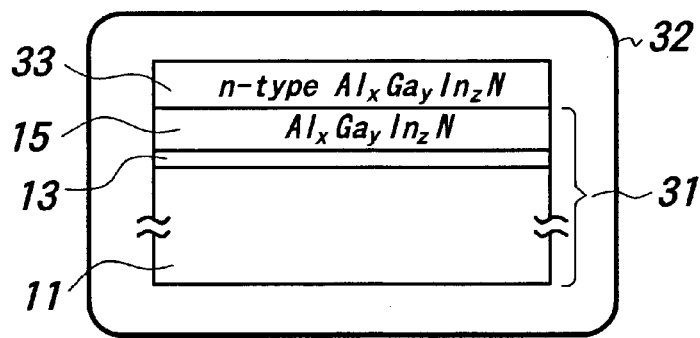
FIGS. 4a–4d are cross sectional views showing successive steps in producing a light emitting diode having an epitaxial growth substrate according to the present invention.

FIGS. 4a–4d are cross sectional views showing successive steps in producing a light emitting diode using the above epitaxial growth substrate. In this example, according to the successive steps shown in FIGS. 2, an epitaxial growth substrate 31 has the sapphire substrate 11, the aluminum nitride film 13 with a thickness of 100 Å formed by nitriding the surface of the sapphire substrate 11, and the $Al_xGa_yIn_zN$ film 15 with a thickness of 1 μm formed by epitaxial growth on the aluminum nitride film 13. As shown in FIG. 4a, the epitaxial growth substrate 31 is set into a CVD chamber 32, and an n-type $Al_xGa_yIn_zN$ (x+y+z=1, x,y,z≧0) film 33 is epitaxially grown in a thickness of 2 μm on the $Al_xGa_yIn_zN$ film 15. As mentioned above, since the $Al_xGa_yIn_zN$ film 15 has excellent crystallinity and surface flatness, the n-type $Al_xGa_yIn_zN$ film 33 can have excellent crystallinity and surface flatness.

Figure 4B:
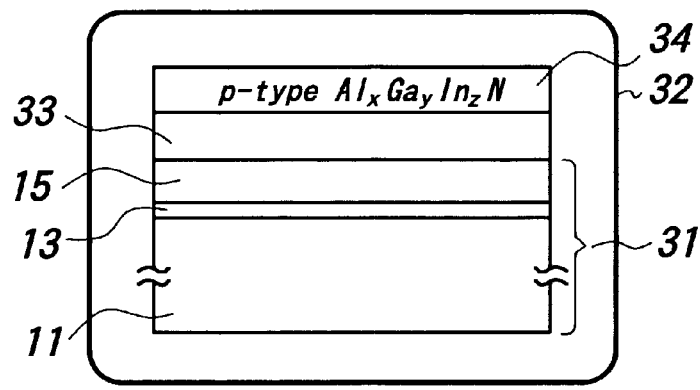
Figure 4C:
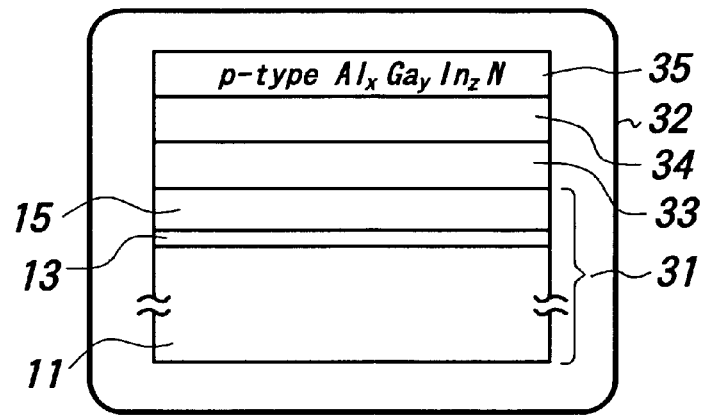
Figure 4D:
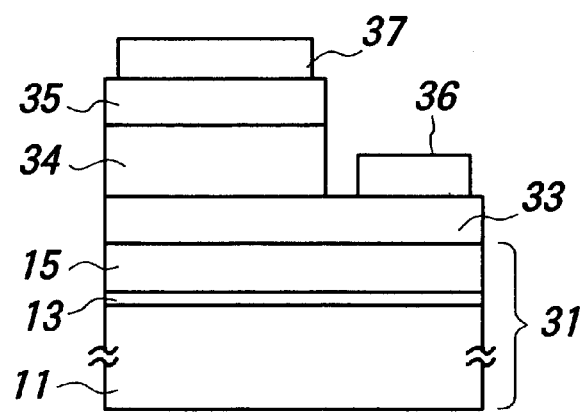

Then, as shown in FIG. 4b, a quantum well structure (not shown) composed of plural $Al_xGa_yIn_zN$ films is formed on the n-type $Al_xGa_yIn_zN$ film 33, and thereafter, a p-type $Al_xGa_yIn_zN$ (x+y+z=1, x,y,z≧0) film 34 is epitaxially grown in a thickness of about 0.5 μm. The p-type $Al_xGa_yIn_zN$ film can have excellent crystallinity and surface flatness due to the crystallinity and surface flatness of the $Al_xGa_yIn_zN$ film 15. Moreover, as shown in FIG. 4c, a low resistive p-type $Al_xGa_yIn_zN$ (x+y+z=1, x,y,z≧0) film 35 is epitaxially grown in a thickness of about 0.5 μm on the p-type $Al_xGa_yIn_zN$ film 34. Lastly, as shown in FIG. 4d, the p-type $Al_xGa_yIn_zN$ films 34 and 35 are partially etched and removed to expose a part of the surface of the n-type $Al_xGa_yIn_zN$ film 33. Then, an electrode 36 is formed on the exposed part of the surface of the n-type $Al_xGa_yIn_zN$ film 33 and an electrode 37 is formed on the low resistive p-type $Al_xGa_yIn_zN$ film 35.

For obtaining a desired light emitting wavelength and light emitting efficiency, it is obvious to change the respective compositions of the $Al_xGa_yIn_zN$ films 15, 33, 34 and 35. Moreover, for developing the light emitting efficiency, it is possible to fabricate a quantum well structure between the $Al_xGa_yIn_zN$ films 15 and 33.

Figure 5A:
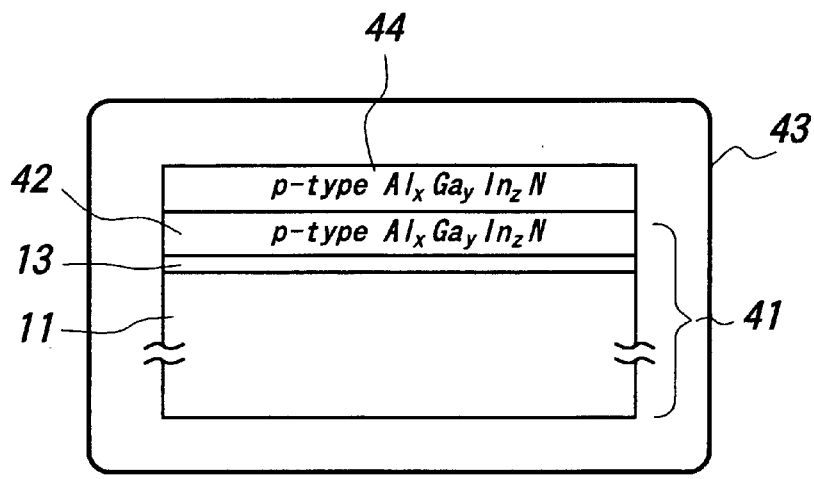
FIGS. 5a–5c are cross sectional views showing successive steps in producing a light emitting diode having another epitaxial growth substrate according to the present invention.
Figure 5B:
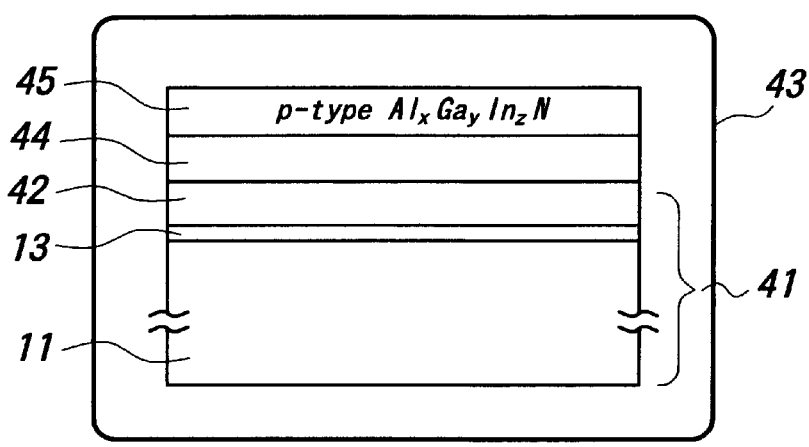
Figure 5C:
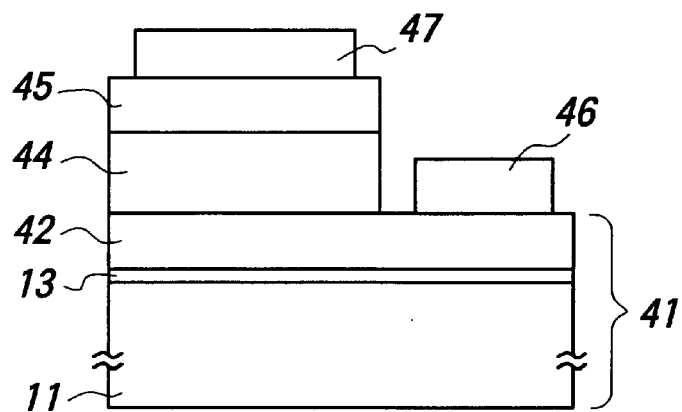

FIGS. 5a–5c are cross sectional views showing successive steps in producing a light emitting diode using another epitaxial growth substrate according to the present invention. Although in the above example, the n-type $Al_xGa_yIn_zN$ film 33, the p-type $Al_xGa_yIn_zN$ film 34 and the p-type $Al_xGa_yIn_zN$ film 35 are formed on the epitaxial growth substrate 31 according to the present invention in turn, in this example, n-type impurities are doped into an $Al_xGa_yIn_zN$ (x+y+z=1, x,y,z≧0) film 42 constituting an epitaxial growth substrate 41 as shown in FIG. 5a. Therefore, in this case, the epitaxial growth substrate 41 is set into a CVD chamber 43, and then, a p-type $Al_xGa_yIn_zN$ (x+y+z=1, x,y, z≧0) film 44 is epitaxially grown on the n-type $Al_xGa_yIn_zN$ film 42. Next, as mentioned above, a low resistive p-type $Al_xGa_yIn_zN$ (x+y+z=1,x,y,z≧0) film 45 is epitaxially grown on the p-type $Al_xGa_yIn_zN$ film 44 as shown in FIG. 5b, and then, electrodes 46 and 47 are formed on the n-type $Al_xGa_yIn_zN$ film 42 and the low resistive p-type $Al_xGa_yIn_zN$ film 45, respectively.

Although the present invention was described in detail with reference to the above examples, this invention is not limited to the above disclosure and every kind of variation and modification may be made without departing from the scope of the present invention.

For example, the above epitaxial growth substrate may be composed of a SiC substrate or a GaN substrate as a base material instead of the sapphire substrate. Moreover, using the epitaxial growth substrate, another electronic device such as a light emitting diode to emit another color light or ultraviolet light, a laser diode and a field effect transistor can be produced.

Moreover, in the above examples, the epitaxially grown $Al_xGa_yIn_zN$ film on the sapphire substrate is polished by chemical mechanical polishing, but it may done by mechanical polishing or the combination of chemical mechanical polishing and mechanical polishing.

As mentioned above, the epitaxial growth substrate of the present invention has an $Al_xGa_yIn_zN$ film with excellent crystallinity and surface flatness thereon which is epitaxially grown on a base material such as a sapphire substrate directly or via a nitride film formed by nitriding the surface of the base material and is polished. Therefore, an additional $Al_xGa_yIn_zN$ film formed by epitaxial growth on the epitaxial growth substrate can have excellent crystallinity and surface flatness due to the crystallinity and surface flatness of the $Al_xGa_yIn_zN$ film of the epitaxial growth substrate. As a result, if a light emission element is made by using the epitaxial growth substrate, it can have a high light emission efficiency.

Moreover, in the producing method of the epitaxial growth substrate, since the $Al_xGa_yIn_zN$ film formed on the base material directly or via the nitride film formed by nitriding the surface of the base material can have a large thickness at a high temperature by CVD, it can have its excellent crystallinity. Moreover, the $Al_xGa_yIn_zN$ film can have excellent surface flatness through polishing.

What is claimed is:

1. An epitaxial growth substrate comprising an aluminum-containing base material and an $Al_xGa_yIn_zN$ (x+y+z=1,x,y,z≧0) film, having first and second surfaces, positioned on the base material, said first surface being located proximate a surface of the base material and said second surface being positioned opposite said first ice and being flattened by polishing, said substrate further comprising a high crystallinity nitride film interposed between the base material and the $Al_xGa_yIn_zN$ film and being formed by nitriding the surface of the base material, said high crystallinity nitride film comprising aluminum nitride.

2. An epitaxial growth substrate as defined in claim 1, wherein the second surface of the $Al_xGa_yIn_zN$ film has a surface roughness Ra of less than 10 Å.

3. An epitaxial growth substrate as defined in claim 1, wherein the $Al_xGa_yIn_zN$ film has a thickness of about 1.0 μm.

4. An epitaxial growth substrate as defined in claim 1, wherein the base material is composed of a sapphire substrate.

5. A light emitting diode comprising an epitaxial growth substrate as defined in claim 1.

6. A method for producing an epitaxial growth substrate comprising the steps of:
   preparing an aluminum-containing base material;
   forming a high crystallinity nitride film on the base material by nitriding the surface of the base material, said high crystallinity nitride film comprising aluminum nitride;
   epitaxially growing an $Al_xGa_yIn_zN$ (x+y+z=1,x,y,z≧0) film, having first and second surfaces, on the high crystallinity nitride film, said first surface being located proximate a surface of said base material, and said second surface being positioned opposite said first surface; and
   polishing said second surface of the $Al_xGa_yIn_zN$ film to a flattened state.

7. A method for producing an epitaxial growth substrate as defined in claim 6, wherein the polishing of the $Al_xGa_yIn_zN$ film is performed by chemical mechanical polishing.

8. A method for producing an epitaxial growth substrate as defined in claim 6, wherein said second surface of the $Al_xGa_yIn_zN$ film is flattened to a surface roughness Ra of less than 10 Å.

9. A method for producing an epitaxial growth substrate as defined in claim 6, wherein the $Al_xGa_yIn_zN$ film is epitaxially grown to a thickness of about 1.1 μm, and is polished to a thickness of about 1.0 μm.

10. A method for producing an epitaxial growth substrate as defined in claim 6, wherein the base material is composed of a sapphire substrate.

* * * * *